United States Patent
Sato

(10) Patent No.: US 8,885,431 B2
(45) Date of Patent: Nov. 11, 2014

(54) SEMICONDUCTOR DEVICE CHANGING AN ACTIVE TIME-OUT TIME INTERVAL

(75) Inventor: Tomoaki Sato, Tokyo (JP)

(73) Assignee: PS4 Luxco S.A.R.L., Luxembourg (LU)

(*) Notice: Subject to any disclaimer, the term of this patent is extended or adjusted under 35 U.S.C. 154(b) by 95 days.

(21) Appl. No.: 13/137,030

(22) Filed: Jul. 15, 2011

(65) Prior Publication Data

US 2012/0026813 A1    Feb. 2, 2012

(30) Foreign Application Priority Data

Jul. 30, 2010    (JP) .................................. 2010-171743

(51) Int. Cl.
  *G11C 7/00*    (2006.01)
  *G11C 11/406*    (2006.01)
(52) U.S. Cl.
  CPC ........ *G11C 11/406* (2013.01); *G11C 11/40618* (2013.01); *G11C 11/40615* (2013.01); *G11C 11/40622* (2013.01)
  USPC .............................. 365/222; 365/194; 365/149
(58) Field of Classification Search
  CPC .................... G11C 11/406; G11C 11/40618
  USPC .............................. 365/222, 230.03, 194, 149
  See application file for complete search history.

(56) References Cited

U.S. PATENT DOCUMENTS

| 6,862,237 | B2* | 3/2005 | Kato ............................. 365/222 |
| 7,042,786 | B2* | 5/2006 | Oh ................................ 365/222 |
| 7,486,584 | B2* | 2/2009 | Kajigaya ....................... 365/222 |
| 7,768,858 | B2* | 8/2010 | Lee ............................... 365/222 |
| 2003/0123298 | A1 | 7/2003 | Kato |

FOREIGN PATENT DOCUMENTS

| JP | 9-213066 A | 8/1997 |
| JP | 2003-196977 A | 7/2003 |

* cited by examiner

*Primary Examiner* — Kretelia Graham
(74) *Attorney, Agent, or Firm* — McGinn IP Law Group, PLLC

(57) ABSTRACT

A device includes a plurality of memory areas each including a plurality of memory cells required to perform refresh of information stored therein by a plurality of sense amplifiers, a first control circuit determining, in connection with one refresh requirement signal at a time, a number of refresh-target memory areas to produce a determined number, a second control circuit controlling, in accordance with the one refresh requirement signal at a time, refresh operation with respect to the refresh-target memory areas, and a third control circuit adjusting, in connection with the refresh operation, an active time-out time interval according to the determined number. The active time-out time interval indicates a time interval from a first time instant when the sense amplifiers are activated to a second time instant when word lines related to the refresh-target memory areas are inactivated.

24 Claims, 14 Drawing Sheets

SEMICONDUCTOR DEVICE CHANGING AN ACTIVE TIME-OUT TIME INTERVAL

This application is based upon and claims the benefit of priority from Japanese patent application No. 2010-171743, filed on Jul. 30, 2010, the disclosure of which is incorporated herein in its entirety by reference.

BACKGROUND OF THE INVENTION

1. Field of the Invention

This invention relates to a semiconductor device and, in particular, to a semiconductor device including memory cells required to refresh.

2. Description of Related Art

In semiconductor devices such dynamic random access memories (DRAMs), it is necessary to periodically perform refresh operation in order to continuously hold data stored in volatile memory cells. Inasmuch as the refresh operation causes a plurality of sense amplifiers to simultaneously activate, there is a high possibility that the refresh operation makes a unique internal power supply voltage included in the semiconductor device fluctuate as compared with normal access operation. Consequently, Japanese Unexamined Patent Application Publication of Tokkai No. 2003-196977 (which will be also called Patent Document 1), which corresponds to U.S. Patent Application Publication No. 2003/0123298 A1, makes a suggestion about a semiconductor memory device wherein it makes a differential amplification time interval of a bit line pair differ between the normal access operation and the refresh operation.

In addition, Japanese Unexamined Patent Application Publication of Tokkai No. Hei 9-213066 (which will be also called Patent Document 2) offers a suggestion concerning a technique using a bank register in order to selectively operate a part of a plurality of banks configuring a memory cell array.

In the manner which is described above, an influence upon the internal power supply voltage differs between the normal access operation and the refresh operation. In a case of performing the refresh operation, the extend of the influence upon the internal power supply voltage differs according to the number of banks which become a subject of refresh and/or according to the number of segments in each bank that become a subject of refresh. When the internal power supply voltage reduces, it has a want of electrical charges for restore on operating the refresh. It results in the creation of problems where it is impossible to perform a sufficient restore with respect to the memory cells which become a subject of refresh.

SUMMARY

The present invention seeks to solve one or more of the above problems, or to improve upon those problems at least in part.

In one embodiment, there is provided a device that includes a plurality of memory areas each including a plurality of memory cells required to perform refresh of information stored therein by means of sense amplifiers, a first control circuit determining, in connection with one refresh requirement signal (a single refresh request signal) at a time, a number of at least one of refresh-target memory areas among the plurality of memory areas that become target of the refresh to produce a determined number of refresh-target memory areas, a second control circuit controlling, in accordance with the one refresh requirement signal at a time, refresh operation with respect to the refresh-target memory areas, and a third control circuit adjusting, in connection with the refresh operation, an active time-out time interval according to the determined number of refresh-target memory areas, the active time-out time interval indicating a time interval from a first time instant when the sense amplifiers are activated to a second time instant when word lines related to the refresh-target memory areas are inactivated.

In another embodiment, there is provided a method that comprises controlling a device. The device includes a plurality of memory areas each including a plurality of memory cells. The controlling includes selecting a number of memory areas activated in accordance with one refresh operation, and changing an active time-out time interval in accordance with the number of memory areas activated. The active time-out time interval indicates a time interval from a first time instant when a plurality of sense amplifiers related to refresh-target memory cells is activated to a second time instant when a plurality of word lines related to the refresh-target memory areas is inactivated.

In still another embodiment, there is provided a device that includes a plurality of memory areas, a register holding information indicative of refresh-target memory areas among the plurality of memory areas, an execution control circuit controlling refresh operation for the refresh-target memory areas on the basis of the information held in the register, a number (count) of refresh-target areas determining circuit determining a number of the refresh-target memory areas on the basis of the information held in the register to produce a determined number, and an active time-out time interval control circuit controlling an active time-out time interval in the refresh operation in accordance with the determined number.

ADVANTAGEOUS EFFECT OF THE INVENTION

In one aspect, it is possible to set an active time-out suitably according to the determined number of refresh-target memory areas. As a result of this, the recovery time of an internal power supply voltage is guaranteed, and it is possible to restore it to the memory cell suitably.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Specifically, a semiconductor device according to an exemplary embodiment of a technical idea of the present invention comprises a plurality of memory areas (114 or 115 in FIG. 1) each including a plurality of memory cells which are required with refresh for maintaining information by sense amplifiers, a first control circuit (121 in FIG. 1) for determining, in connection with one refresh requirement signal at a time, a number of refresh-target memory areas among the plurality of memory areas that become target of the refresh to produce a determined number of refresh-target memory areas, a second control circuit (123 in FIG. 1) controlling, in accordance with the one refresh requirement signal at a time, refresh operation with respect to the refresh-target memory areas, and a third control circuit (122 in FIG. 1) adjusting, in connection with the refresh operation, an active time-out time interval according to the determined number of refresh-target memory areas, the active time-out time interval indicating a time interval from a first time instant when the sense amplifiers are activated to a second time instant when word lines related to the refresh-target memory areas are inactivated.

In the semiconductor device, inasmuch as the active time-out time interval is controlled in accordance with the number of the refresh-target memory areas, a restore is suitably carried out for each memory cell on refresh operation. In other words, it is possible to supply respective desired restore potentials to the plurality of memory cells which the determined number of memory areas include.

Now, the description will proceed to exemplary embodiments of this invention with reference to drawings.

Figure 1:
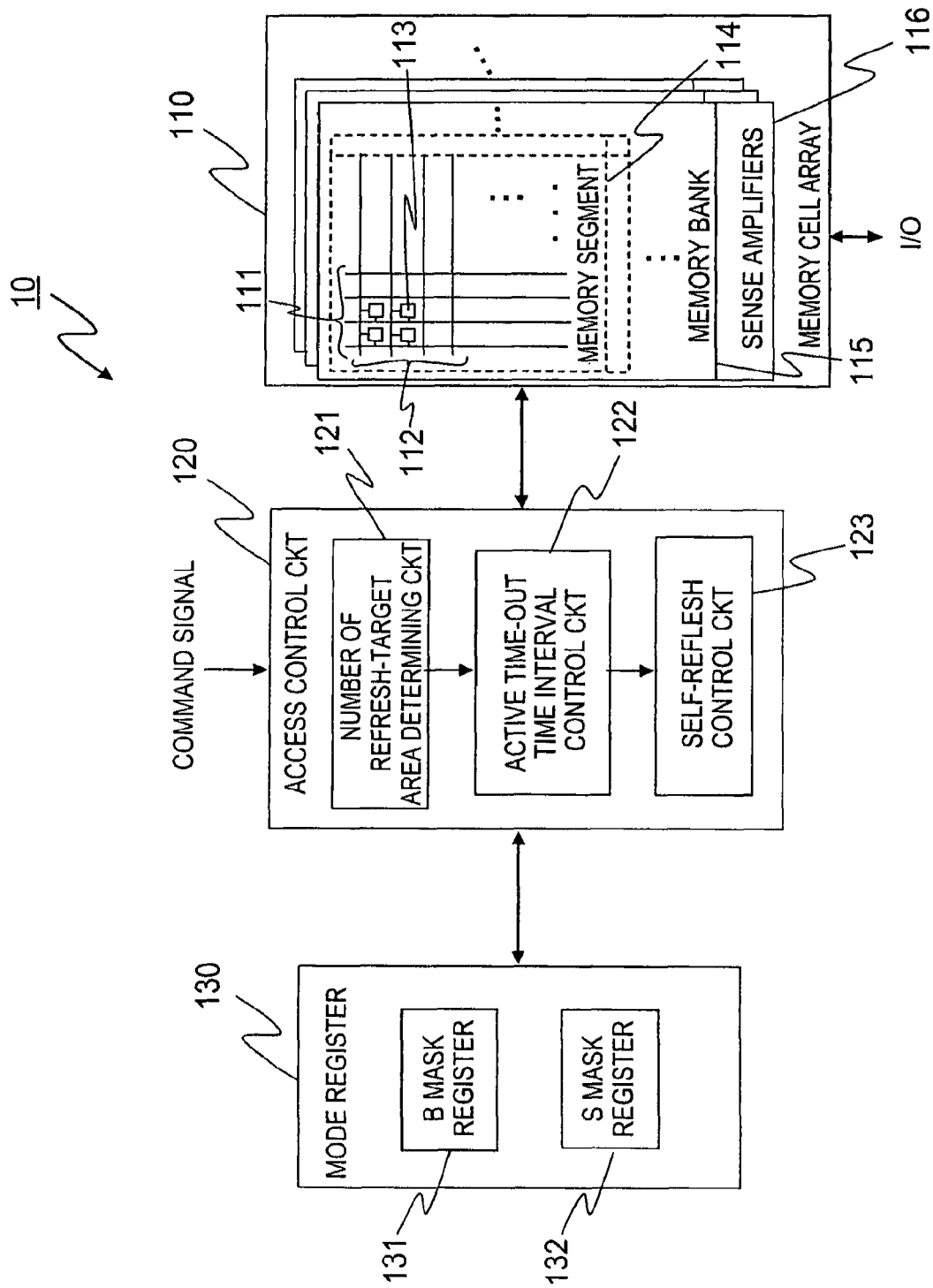
FIG. 1 is a block diagram showing schematic structure of a semiconductor device according to a first exemplary embodiment of this invention.

FIG. 1 is a block diagram showing a schematic structure of a semiconductor device (DRAM) 10 according to a first exemplary embodiment of this invention.

As shown in FIG. 1, the illustrated semiconductor device 10 comprises a memory cell array 110, an access control circuit 120 for carrying out an access control for the memory cell array 110, and a mode register 130 for storing mode data for use in the memory access.

The memory cell array 110 includes a plurality of word lines 111, a plurality of bit lines 112, and a plurality of memory cells 113 which are connected to the word lines 111 and the bit lines 112 and which are arranged in a matrix fashion. The plurality of memory cells 113 constitute one or more memory segments 114 each of which comprises a predetermined number of memory cells 113 as one unit. The memory segments 114 constitute one or more memory banks 115 each of which comprises a predetermined number of memory segments 114 as one unit. A subject of refresh operation is in memory segments 114 or in memory banks 115. That is, in the instant specification, each of the memory segments 114 and the memory banks 115 is called a memory area serving as a target for refresh.

The memory cell array 110 further comprises a plurality of sense amplifiers 116. FIG. 1 depicts so that the sense amplifiers 116 are provided with the respective memory banks 115 in one-to-one correspondence therewith. However, in reality, the sense amplifiers 116 compose a sense amplifier array (SAA) provided with each bit line (pair) in each of a plurality of memory mats included in one memory segment 114. In addition, one memory mat is one unit constituting the memory segment 114 and includes a predetermined number of memory cells 113.

In each of the plurality of memory segments 114, a plurality of memory mats is associated with one data bus in the memory cell array 110 through a plurality of column switches accompanied with a plurality of sense amplifier arrays corresponding thereto. Accordingly, a plurality of memory mats has an exclusive-controlled bearing on one another. On the other hand, in the memory cell array 110, a plurality of memory segments 114 associated with a plurality of data buses, respectively, has a nonexclusive-controlled bearing on one another. In addition, a plurality of memory banks 115 has a nonexclusive-controlled bearing on one another because they are associated with a plurality of data buses which are different from one another in the memory cell array 110.

The access control circuit 120 comprises a number (count) of refresh-target areas determining circuit 121, an active time-out time interval control circuit 122, and a self-refresh control circuit 123.

The number (count) of refresh-target areas determining circuit 121 determines, on the basis of set contents of the mode register 130, a number of memory areas which become target for the refresh.

The active time-out time interval control circuit 122 controls an active time-out time interval on the basis of the number of the memory areas determined by the number (count) of refresh-target areas determining circuit 121. This control is carried out so that the active time-out time interval becomes long when the number of memory areas is high.

The self-refresh control circuit 123 performs, in accordance with the set contents of the mode register 130, refresh operation with respect to the memory cell array 110. In this event, the self-refresh control circuit 123 is subjected to control of the active time-out time interval by the active time-out time interval control circuit 122. The active time-out time interval is a time interval from a first time instant when the sense amplifiers 116 connected to the refresh-target memory cells 113 are activated to a second time instant when the word lines 111 connected to the refresh-target memory cells 113 are inactivated.

The mode register 130 comprises a B (bank) mask register 131 and an S (segment) mask register 132. The B mask register 131 is used to store information (mode data) indicating that whether or not it makes each memory bank 115 the target of the refresh operation. The S mask register 132 is used to store information indicating that whether or not it makes each memory segment 114 the target of the refresh operation.

Referring now to FIGS. 2 through 16, the description will proceed to the semiconductor device 10 in detail.

Figure 2:
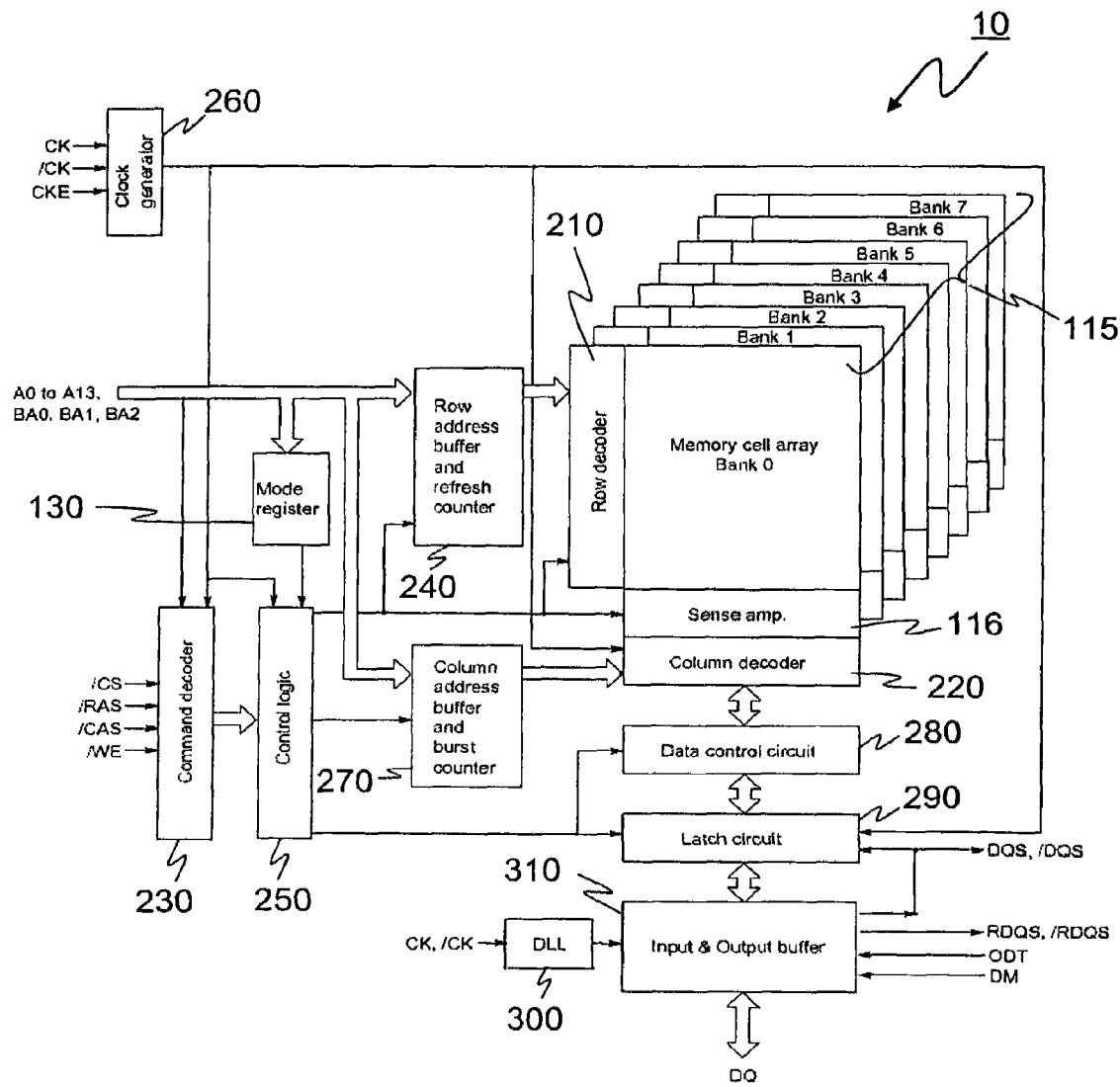
FIG. 2 is a block diagram showing schematic structure of the semiconductor device illustrated in FIG. 1.

FIG. 2 is a block diagram showing a brief configuration of the semiconductor device 10. The semiconductor device 10 is a synchronous semiconductor memory device. The illustrated semiconductor device 10 comprises a row decoder 210, a column decoder 220, a command decoder 230, a row address buffer and refresh counter 240, a control logic circuit 250, a synchronous clock generator 260 for the synchronous semiconductor memory device, a column address buffer and burst counter 270, a data control circuit 280, a latch circuit 290, a delay locked loop (DLL) 300, and an input/output buffer 310. The semiconductor device 10 further comprises an internal power supply circuit 1210 (see FIG. 13) for generating a predetermined internal power supply potential from a power supply potential supplied from the outside to supply the predetermined internal power supply potential to the sense amplifiers 116 as a power supply.

The self-refresh control circuit 123 of FIG. 1 is implemented by a combination of the control logic circuit 250, the row address buffer and refresh counter 240, the row decoder 210, the column address buffer and burst counter 270, the column decoder 220, and the sense amplifiers 116.

In addition, both of the number (count) of refresh-target areas determining circuit 121 and the active time-out time interval control circuit 122 are implemented by the control logic circuit 250.

Figure 3:
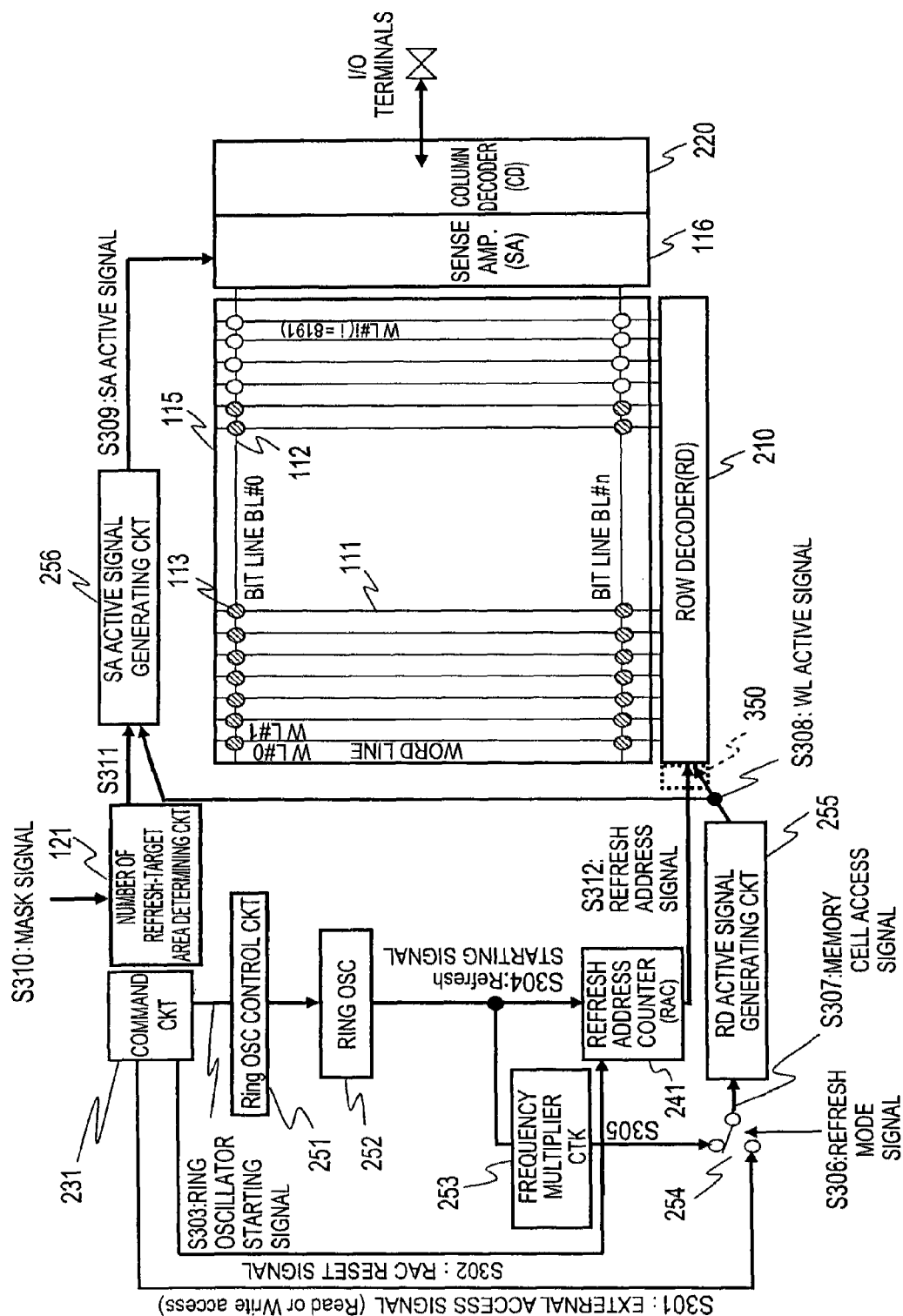
FIG. 3 is a block diagram showing structure of a main portion of the semiconductor device illustrated in FIG. 1.

Referring now to FIG. 3, the description will proceed to the semiconductor device 10 in further detail.

FIG. 3 is a block diagram showing a main configuration of the semiconductor device 10 illustrated in FIG. 2 as the center of command decoder 230, the control logic circuit 250, and the row address buffer and refresh counter 240.

The memory bank 115 comprises a plurality of memory cells 113 arranged in a matrix fashion, a plurality of word lines 111 (WL#1 to WL#i) (i represents a natural number) connected to the memory cells 113, a plurality of bit lines 112 (BL#1 to BL#n) (n represents a natural number) connected to the memory cells 113.

The row decoder (RD) 210 are connected to the word lines 111 while the sense amplifiers (SAs) 116 and the column decoder (CD) 220 are connected to the bit lines 112.

A command circuit 231 is included in the command decoder 230 and generates and produces various types of command signals (control signals) in accordance with an input command from the outside. For example, the command circuit 231 produces an external access signal S301 such as a write access command, a read access command, or the like, an RAC (refresh address counter) reset signal S302, and a ring oscillator starting signal S303.

A ring oscillator control circuit 251 and a ring oscillator 252 are included in the control logic circuit 250 and generate, as a refresh starting signal S304, an OSC (oscillator) signal having a predetermined period under control of the command circuit 231.

A frequency multiplier circuit 253, a switch 254, an RD active signal generating circuit 255, a SA active signal generating circuit 256, and the number (count) of refresh-target areas determining circuit 121 are also included in the control logic circuit 250.

The frequency multiplier circuit 253 generates, on the basis of one refresh starting signal S304, internal refresh signals S305 at n times in time sequence. This can be understood in FIG. 8 which will later be described. For example, the above-mentioned n is equal to either the number of banks or the number of segments. Otherwise, the above-mentioned n is equal to the number obtained by multiplying the number of banks by the number of segments. A candidate for other number of n will later be described in FIG. 8.

The switch 254 selects, in accordance with a refresh mode signal S306, one of the external access signal S301 and the internal refresh signal S305 to supply a selected signal to the RD active signal generating circuit 255 as a memory cell access signal S307.

The RD active signal generating circuit 255 generates a WL (word line) active signal S308 in accordance with the memory cell access signal S307 supplied from the switch 254. The word line active signal S308 is supplied to the row decoder 210 and also to the SA active signal generating circuit 256.

The SA active signal generating circuit 256 generates, in accordance with the WL active signal S308, an SA (sense amplifier) active signal S309 which is supplied to the sense amplifiers 116. In addition, in the manner which will later be described, the SA active signal generating circuit 256 generates a delayed signal obtained by delaying the SA active signal S309 that is supplied to the RD active signal generating circuit 255. A circuit for controlling a delay time of the delayed signal is the active time-out time interval control circuit 122 illustrated in FIG. 1.

The number (count) of refresh-target areas determining circuit 121 generates, on the basis of a mask signal S310 indicative of the set information of the mode register 130, a delay selection signal (DLSEL) S311 in accordance with a refresh-target area count that is supplied to the active time-out time interval control circuit 122 included in the SA active signal generating circuit 256. The active time-out time interval control circuit 122 controls, in accordance with the delay selection signal S311, the delay time for delaying the SA active signal S309.

A refresh address counter (RAC) 241 is included in the row address buffer and refresh counter 240. The RAC 241 carries out a count-up operation in accordance with the refresh starting signal S304 to generate a refresh address signal S312. In addition, the RAC 241 sets, in accordance with the RAC reset signal S302 from the command circuit 231, a counted value into an initial value (e.g. a final address: an address of #1FFF=8191 when the word lines are equal in number to 8192).

The row decoder 210 selectively activates the word lines 111 from an address of #0 in turn in accordance with the WL active signal S308 from supplied the RD active signal generating circuit 255 and the refresh address signal S312 from supplied the RAC 241.

The sense amplifies 116 are activated by the SA active signal S309 supplied from the SA active signal generating circuit 256 to carry out sensing operation. An activation of the sense amplifiers 116 is set so that it is carried out after a lapse of a predetermined time interval from a time instant when the word lines 111 are activated by the row decoder 210.

The column decoder 220 selects, as a selected bit line, one of the bit lines 112 in accordance with the bit line active signal supplied from the column address buffer and burst counter 270 (see FIG. 2) to connect the selected bit line to a corresponding I/O terminal (DQ) (through the data control circuit 280, the latch circuit 290, and the input/output buffer 310).

When the refresh command is supplied to the command decoder 230 of the semiconductor device 10 configured in the manner which is described above, the refresh command signal is supplied from the command decoder 230 to the control logic circuit 250. Then, the control logic circuit 250 controls, in accordance with the refresh command signal, respective parts in order to carry out the refresh operation. As a result, the ring OSC 252 serving as a timer produces the refresh starting signal S304 after a lapse of the predetermined time interval and the RAC 241 produces the refresh address signal S312. Responsive to one refresh starting signal S304, the frequency multiplier circuit 235 produces the internal refresh signals S305 at n times in time sequence.

Responsive to the internal refresh signal S305, the RD active signal generating circuit 255 generates the WL active signal S308 to supply the generated WL active signal S308 to the row decoder 210 and the SA active signal generating circuit 246. Responsive to the WL active signal S308, the SA active signal generating circuit 256 generates the SA active signal S309 in accordance with the WL active signal S308 to supply it to the sense amplifiers 116.

Figure 4:
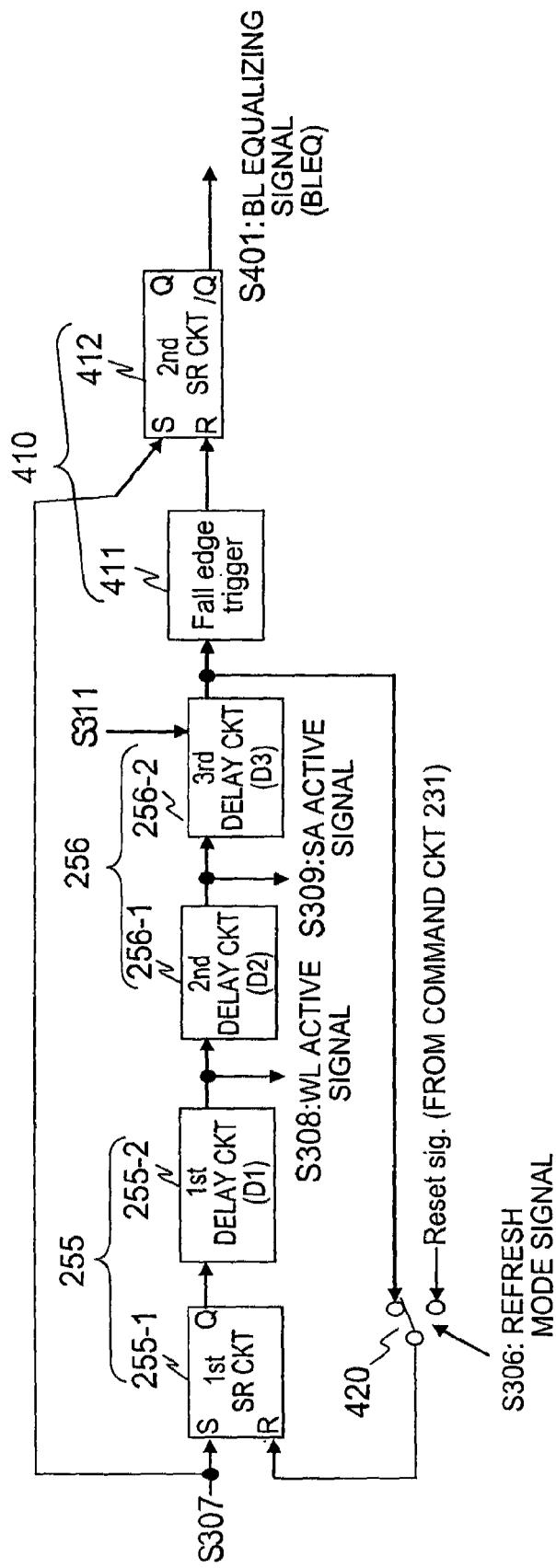
FIG. 4 is a block diagram showing an example of internal structure of an RD active signal generating circuit and SA active signal generating circuit shown in FIG. 3.

FIG. 4 is a view showing an example of a main internal structure of the RD active signal generating circuit 255 and the SA active signal generating circuit 256. The RD active signal generating circuit 255 and the SA active signal generating circuit 256 serve as an active time-out circuit. The SA active signal generating circuit 256 is connected to a bit line equalizing control circuit 410 for equalizing a potential of the bit line pair at a rear stage thereof.

As shown in FIG. 4, the RD active signal generating circuit 255 includes a first SR (set/reset) circuit 255-1 and a first delay circuit 255-2. The SA active signal generating circuit 256 includes a second delay circuit 256-1 and a third delay circuit 256-2. A selector switch 420 is disposed between the RD active generating circuit 255 and the SA active signal generating circuit 256.

The bit line equalizing control circuit 410 comprises a fall edge trigger 411 and a second SR (set/reset) circuit 412.

In FIG. 4, the memory cell access signal S307 is supplied to a set terminal of the first SR circuit 255-1 and to a set terminal of the second SR circuit 412. As a result of this, both of the first SR circuit 255-1 and the second SR circuit 412 are put into a set state.

The first delay circuit 255-2 delays a Q output of the first SR circuit 255-1 by a first predetermined time D1 (which corresponds to a delay time of the second SR circuit) to produce a first delayed signal as the WL active signal S308. The second delay circuit 256-1 delays the WL active signal S308 by a second predetermined time D2 (e.g. 10 ns) to produce a second delayed signal as the SA active signal S309.

The third delay circuit 256-2 delays one of the SA active signal S309 branched by a time interval (a third delay time D3) selected by the delay selection signal S311. The obtained delayed signal is supplied to a reset (R) terminal of the first SR circuit 255-1 through the selector switch 420. After the first SR circuit 255-1 is reset, the WL active signal S308 changes into a low level and the SA active signal S309 changes into a low level. The third delay time D3 is controlled by the delay selection signal S311 which will later be described. Details of the third delay circuit 256-2 are disclosed in FIG. 15 which will later be described.

When the WL active signal S308 becomes a high level, charges accumulated in the memory cell serving as target for the refresh cause the bit line pair to a potential difference. When the SA active signal S309 becomes a high level, the potential difference between the bit line pair is amplified by the sense amplifier so that restore of stored information of the memory cell is carried out.

Except when the semiconductor device 10 is put into the refresh mode, the selector switch 420 is connected to the reset signal terminal side so that the first SR circuit 255-1 is reset by an external commend (e.g. a precharge command or the like).

On the other hand, in the bit line equalizing control circuit 410, when the memory cell access signal S307 is supplied to the set terminal of the second SR circuit 412, it makes a bit line (BL) equalizing signal (BLEQ) S401 a low level. When fall edge trigger 411 detects a fall edge of an output of the third delay circuit 256-2, the second SR circuit 412 makes the BL equalizing signal S401 a high level.

Figure 5:
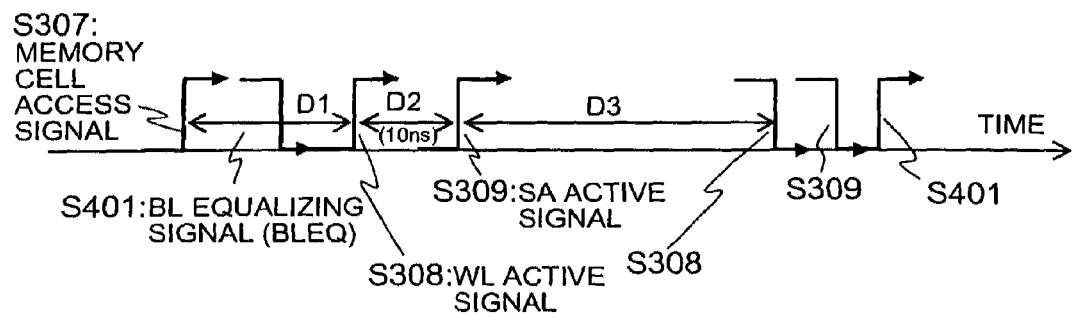
FIG. 5 is a timing chart for respective signals in the circuit illustrated in FIG. 4.

FIG. 5 is a time chart of respective signals in the circuit shown in FIG. 4.

As shown in FIG. 5, when the memory cell access signal S307 changes into the high level, the BL equalizing signal (BLEQ) S401 changes into the low level. After a lapse of the first delay time D1 from a time instant when the memory cell access signal S307 changes the high level, the WL active signal S308 changes the high level. After a lapse of the second delay time D2 from this time instant, the SA active signal S309 changes into the high level. Thereafter, after a lapse of the third delay time D3 (e.g. 30 ns) from this time instant, the WL active signal S308 and the SA active signal S309 successively change the low level and the bit line equalizing signal S401 changes the high level. The third time D3 is a time interval required to re-inject (restore) the electric charges from the sense amplifier 116 to the memory cell 113 serving as the target for the refresh. In the exemplary embodiment, the third delay time D3 is changed in accordance with the number of memory areas which become target for he refresh. It is therefore possible to change, in accordance with the number of the memory areas which become target for the refresh, an active time-out time interval between a time instant when the sense amplifiers are activated and a time instant when the word lines connected to the memory cells serving as target for the refresh are inactivated. That is, it is possible to adjust a sensing time interval due to the sense amplifiers, namely, a time interval for restoring the store information in the memory cells in accordance with the number of memory areas which become target for the refresh.

Now, the description will proceed to configuration for adjusting the third delay time D3 in detail.

In the manner which is described above, the mode register 130 comprises the B mask register 131 and the S mask register 132. These registers correspond to mode registers (MRs) 16 and 17 in JEDEC Standard in which standard group related to LLDR2 (Low Power Double Data Rate 2) recommend.

The MR 16 is composed of eight bits representing first through eighth bank operation values OP0 to OP7 which correspond to first through eighth bank0 to bank7, respectively. The MR 17 is composed of eight bits representing first through eighth segment operation values OP0 to OP7 which correspond to first through eighth segment0 to segment7, respectively. By setting respective bits of those operation values into logic "1" level, it is possible to make corresponding banks or corresponding segments outside target for the refresh. In default state, those values have logic "0" level so that corresponding banks or corresponding segments are target for the refresh. The B mask register 131 and the S mask register 132 are constructed on conformance with the MR 16 and the MR 17, respectively.

If any of set information of the B mask register 131 and the set information of the S mask register 132 has a logic "1" level, one of the memory banks 115 and the memory segments 114 that corresponds thereto is out of the target for refresh (that is, that refresh operation, namely, holding operation of data is not carried out). For instance, when the fifth through the eighth bank operation values OP4 to OP7 of the B mask register 131 have the logic "1" level and the fifth through the eighth segment operation values OP4 to OP7 of the S mask register 132 have the logic "1" level, the first through the fourth segment0 to segment3 in the first through the fourth bank0 to bank3 are the target for refresh while the fifth through the eighth bank4 to bank7 are out of the target for refresh. That is, memory areas out of the target for refresh are determined by ORing the set information of the B mask register 131 with the set information of the S mask register 132.

Referring to FIGS. 6 through 12, the description will proceed to a relationship between the set information of the B mask register 131 and the set information of the S mask register 132 and memory areas serving as refresh-target.

First, the description will proceed to a relationship between the set information of the B mask register 131 and the memory banks 115 serving as refresh target.

Figure 6:
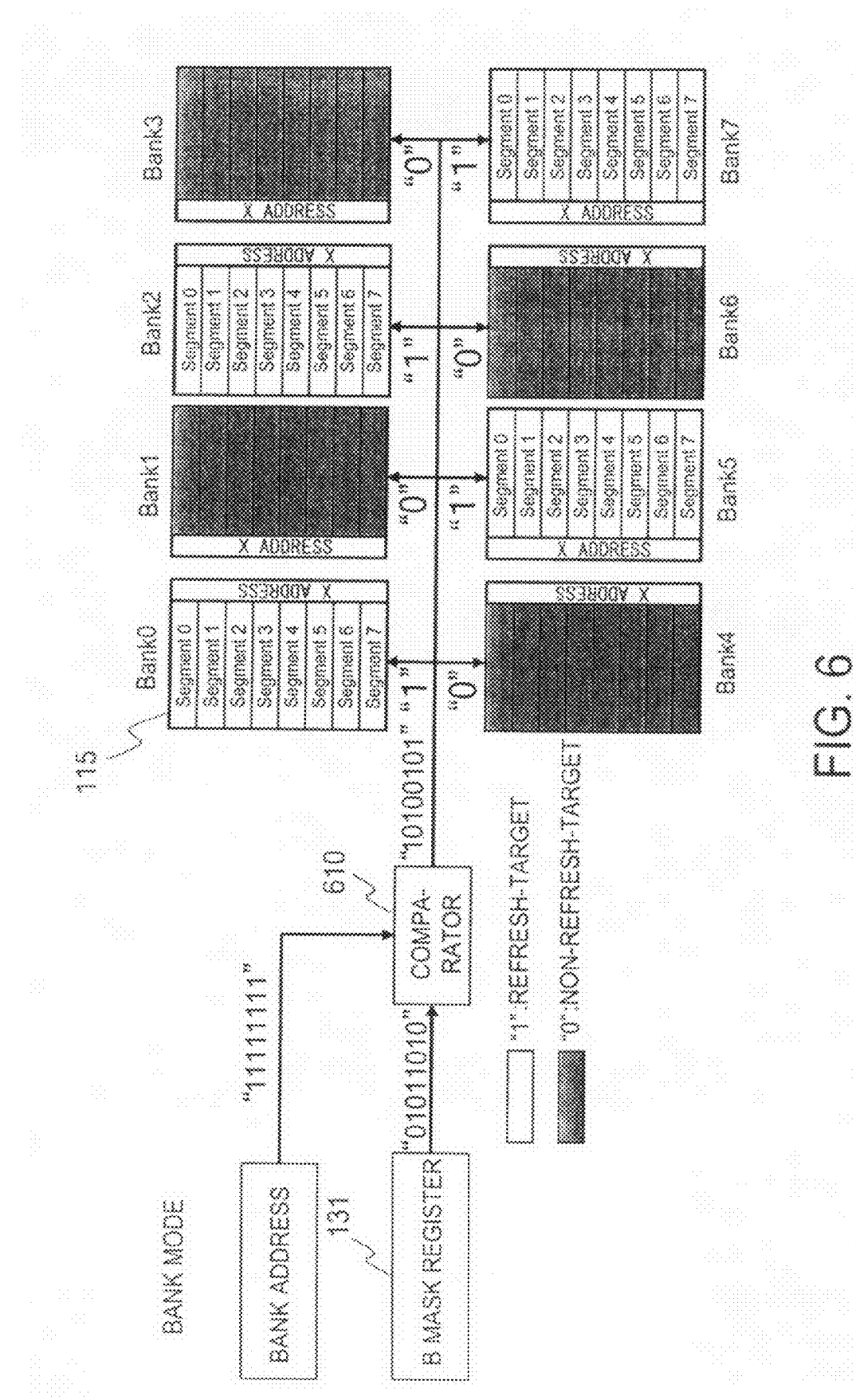
FIG. 6 is a view for use in describing a relationship between set information of a B mask register and refresh-target memory areas.
Figure 7:
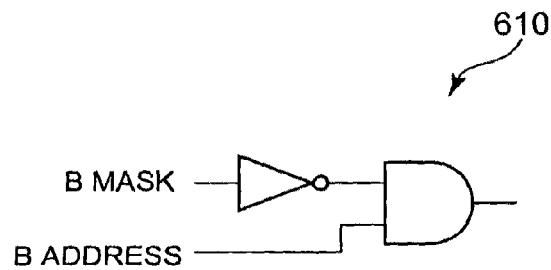
FIG. 7 is a circuit diagram showing an example of structure of a comparator shown in FIG. 6.

As shown in FIG. 6, it will be assumed that the set information of the B mask register 131 has the binary value of "01011010" when the bank address has the binary value of "11111111" (namely, when the semiconductor memory 10 is put into the refresh mode). A comparator 610 compares the bank address with the set information of the B mask register 131 bit-by-bit to produce a comparison result. Specifically, the comparator 610 carries out logic operation bit by bit to produce the comparison result. The comparator 610 may be, for example, composed of a combination of a NOT gate and an AND gate as shown in FIG. 7. In the example being illustrated, the comparator 610 produces the compassion result having the binary value of "10100101".

Figure 8:
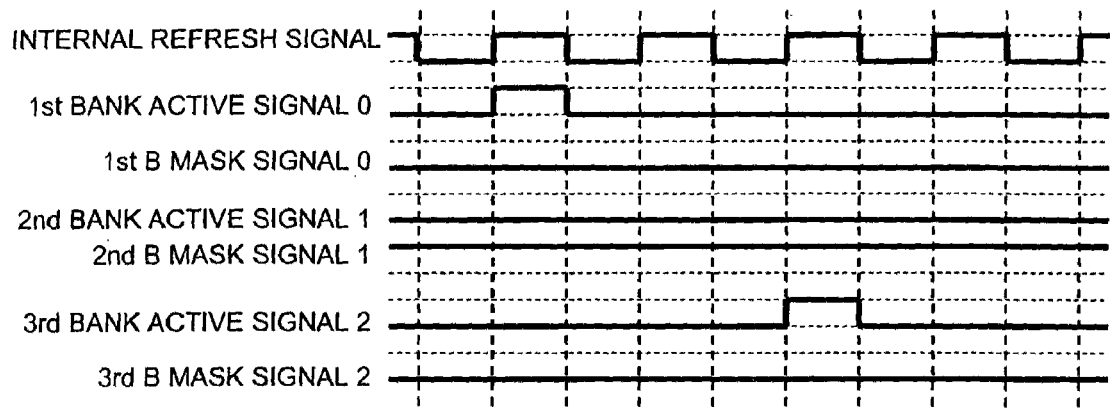
FIG. 8 is a wave form chart for use in describing a relationship between bank active signals and B mask signals.

FIG. 8 shows a part of a relationship between bank active signals and B mask signals. The B mask signals correspond to the set information of the B mask register 131 while an output of the comparator 610 corresponds to the bank active signals. In the example being illustrated, the bank active signals consist of first through eighth bank active signals 0~7 while the B mask signals consist of first through eighth B mask signals 0~7. When the refresh operation is carried out, the bank address has the binary value of "11111111" in order to activate all of the memory banks 115. In response to the bank address, the first through the eighth bank active signals 0~7 should have the logic "high" level in order in time sequence or simultaneously in synchronism with the internal refresh signal S305. However, the first through the eighth bank active signals 0~7 are masked in accordance with the set information of the B mask register 131. In the example being illustrated in FIG. 6, the second, the fourth, the fifth, and the seventh B mask signals 1, 3, 4, and 6 correspond to the second, the fourth, the fifth, and the seventh bank1, bank3, bank4, and bank6 have the logic "1" level, and therefore the second, the fourth, the fifth, and the seventh bank active signals 1, 3, 4, and 6 corresponding thereto are masked. FIG. 8 shows a state where the second bank active signal 1 becomes a logic "low" level at a timing when it intrinsically should become the logic "high" level because it is masked by the second B mask signal 1.

In the manner which is described above, it is possible to make a part of the first through the eighth bank0 to bank7 memory areas (memory banks) serving as the refresh-target and to make the remaining ones memory areas serving as non-refresh-target. In FIG. 8, active timings for the first bank0, the second bank1, and the third bank2 are shifted in time one another. However, the memory banks 115 may be, for example, configured so that a pair of the first bank0 and the fifth bank4, a pair of the second bank1 and the sixth bank5, a pair of the third bank2 and the seventh bank6, and a pair of fourth bank3 and the eighth bank7 are refreshed in time sequence (i.e. the number n of occurrence of the internal refresh signal S305 is equal to four, namely, n=4). In this event, by making target banks of refresh the first, the third, the sixth, and the eighth bank0, bank2, bank5, and bank7 in the manner which is described above, it is possible to reduce the number of sense amplifiers which simultaneously operate to half as compared with a case where it makes all of banks target of refresh.

Then, the description will proceed to a relationship between the set information of the S mask register 132 and the memory segments 114 serving as refresh-target.

Figure 9:
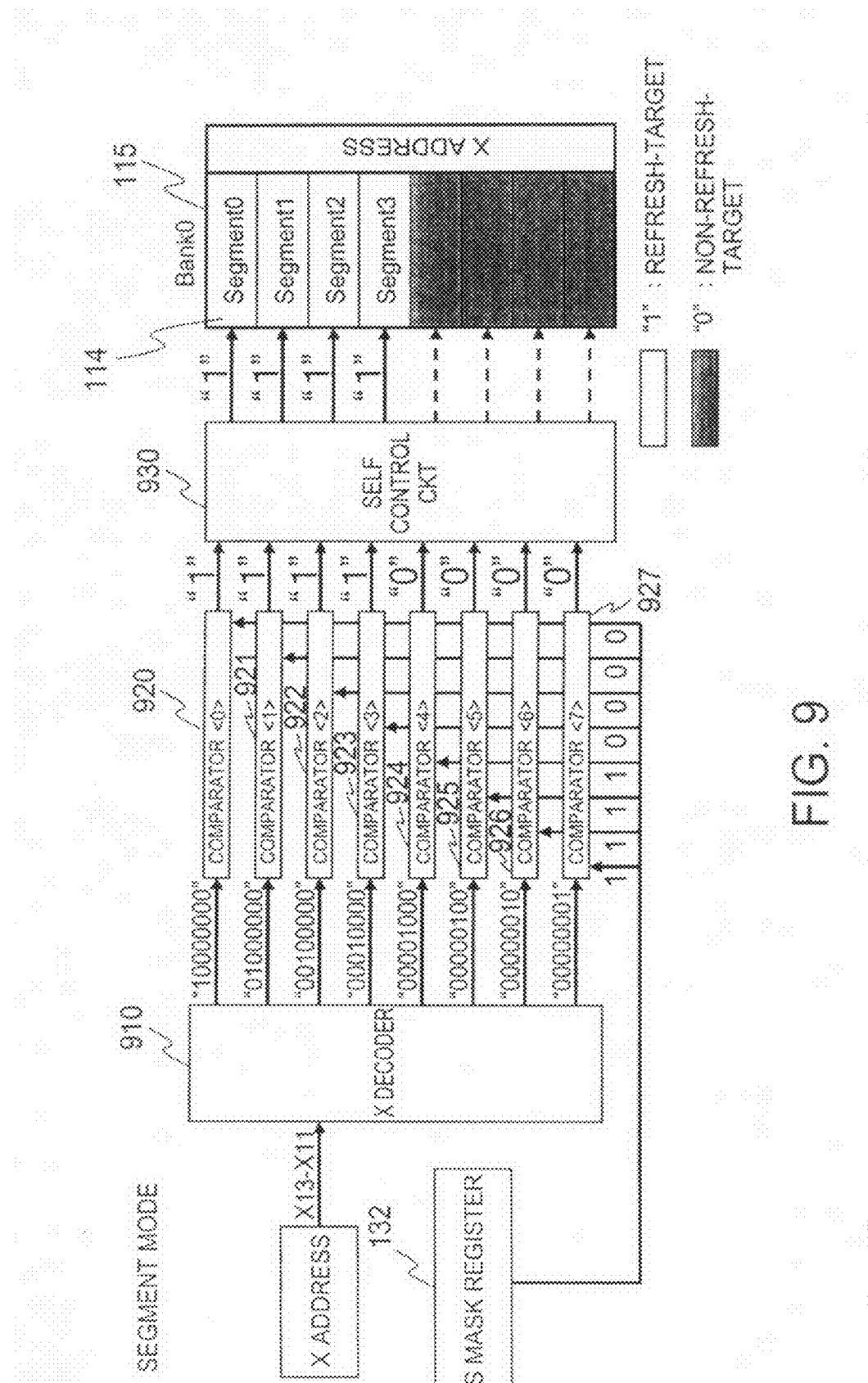
FIG. 9 is a view for use in describing a relationship between set information of a S mask register and the refresh-target memory areas.

Referring to FIG. 9, an X decoder 910 decodes a higher-order address X13-X11 in the refresh address signal S312 from the RAC 241 that are related to selection of the segments. The X decoder 910 supplies a logic "1" level to one of first through eighth comparator 920 to 927 that corresponds to a decoded address. The first through the eighth comparators 920 to 927 are disposed so as to correspond to the first through the eighth segment0 to segment7, respectively.

The first through the eighth comparators 920 to 927 are supplied with 8 bits of information corresponding to the set information of the S mask register 132, respectively. The first through the eighth comparators 920 to 927 compare an output (first through eighth decoded signals 0~7) of the X decoder 910 with bit information (first through eighth S mask signals 0~7) supplied from the S mask register 132 to produce first through eighth comparison results, respectively. Each of first through the eighth comparators 920 to 927 may be configured as that of the comparator 610.

When the first through the eighth comparison results have a logic "1" level, the first through the eighth comparators 920 to 927 allow a self control circuit 930 to supply the internal refresh signal to first through eighth segment0 to segment7, respectively. When the first through the eighth comparison results have a logic "0" level, the first through the eighth comparators 920 to 927 do not allow the self control circuit 930 to supply the internal refresh signal to first through eighth segment0 to segment7, respectively.

In response to outputs of the first through the eighth comparators 920 to 927, the self control circuit 930 supplies the internal refresh signal to the first through the eighth segment0 to segment7 which correspond thereto or inhibits supply thereto.

Figure 10:
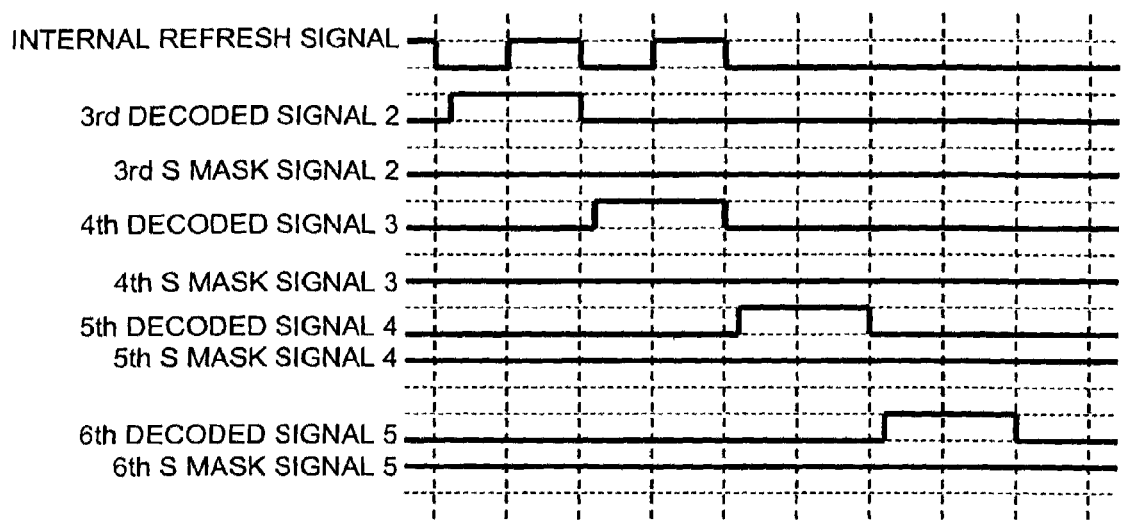
FIG. 10 is a wave form chart for use in describing a relationship among decoded signal, S mask signals, and an internal refresh signal.

FIG. 10 shows a part of a relationship between the first through the eighth decoded signals 0~7, the first through the eighth S mask signals 0~7, and the internal refresh signal. When the refresh operation is carried out, the first through the eighth decoded signals 0~7 supplied to the first through the eighth comparators 920 to 927 have a logic "1 (high)" level in succession in order to activate all of the memory segments 114. On the other hand, the first through the eighth comparators 920 to 927 are supplied with the first through the eighth S mask signals 0~7 indicative of the set information of the S mask register 132, respectively. In the example being illustrated in FIG. 9, the fifth through the eighth S mask signals 4~7 related to the fifth through the eighth segment4 to segment7 have the logic "1" level. Therefore, the fifth through the eighth comparators 924 to 927 do not allow the self control circuit 930 to produce the internal refresh signal although the fifth through the eighth decoded signals 4~7 are supplied to them, respectively. FIG. 10 shows a state where the third and the fourth S mask signals 2 and 3 allow production of the internal refresh signal while the fifth and the sixth S mask signals 4 and 5 inhibit production of the internal refresh signal. In this case also, the memory segments 114 may be, for example, configured so that a pair of the first and the fifth segment0 and segment4, a pair of the second and the sixth segment1 and segment5, a pair of the third and the seventh segment2 and segment6, and a pair of the fourth and the eighth segment3 and segment7 are refreshed in time sequence. In this event, it is possible to reduce the number of sense amplifiers which simultaneously operate to half as compared with a case where it makes all of segments target of refresh.

In the manner which is described above, it is possible to make, on the basis of information set in the S mask register 132, a part of the first through the eighth segment0 to segment7 memory areas (memory banks) serving as the refresh-target and to make the remaining ones memory areas serving as non-refresh-target.

Figure 11:
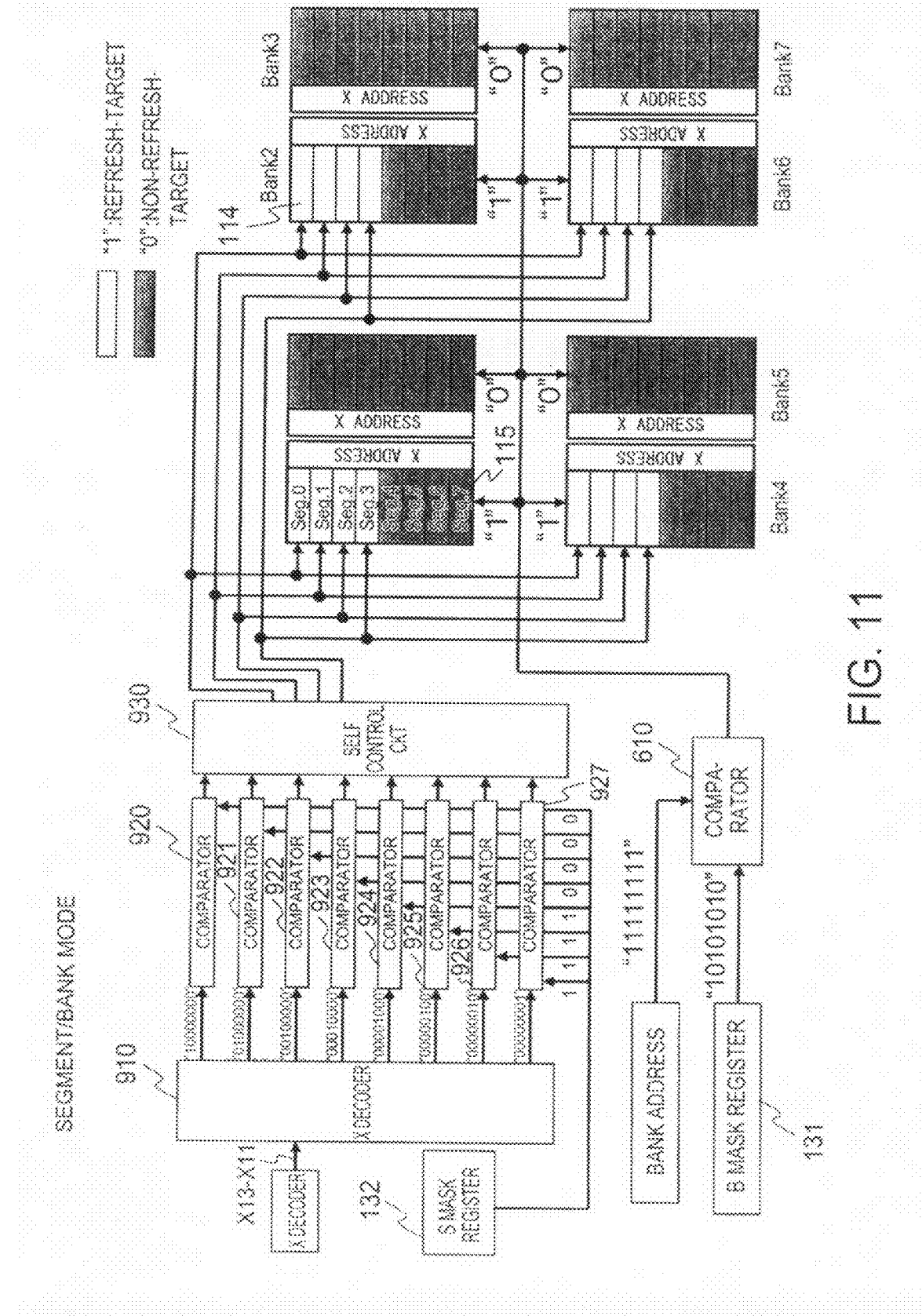
FIG. 11 is a view for use in describing a relationship among set information of the B mask register, set information of the S mask register, and the refresh-target memory areas.

FIG. 11 is a block diagram showing a combination of configuration of FIG. 6 and configuration of FIG. 9 which are described above. With this structure, the memory banks 115 (the second, the fourth, the sixth, and the eighth bank1, bank3, bank5, and bank7) serving as the non-refresh-target by the set information of the B mask register 131 and the memory segments 114 (the fifth through the eighth segment4 to segment7) serving as the non-refresh-target by the set information of the S mask register 132 are set to the non-refresh-target. In other words, the memory segments 114 (the first through the fourth segment0 to segment3) included in the memory banks 115 (the first, the third, the fifth, and seventh bank0, bank2, bank4, and bank6) which are subjected to the refresh-target by the set information of the B mask register 131 and are subjected to the refresh-target by the set information of the S mask register 132 serve as the memory areas of the refresh-target. FIG. 11 shows an example where the second, the fourth, the sixth, and the eighth bank1, bank3, bank5, and bank7 are subjected to the non-refresh-target by the set information of the B mask register 131 and the fifth through the eighth segment4 to segment7 are subjected to the non-refresh-target by the set information of the S mask register 132. In this event, the refresh-target becomes the first through the fourth segment0 to segment3 each of which is included in the first, the third, the fifth, and the seventh bank0, bank2, bank4, and bank6.

Figure 12:
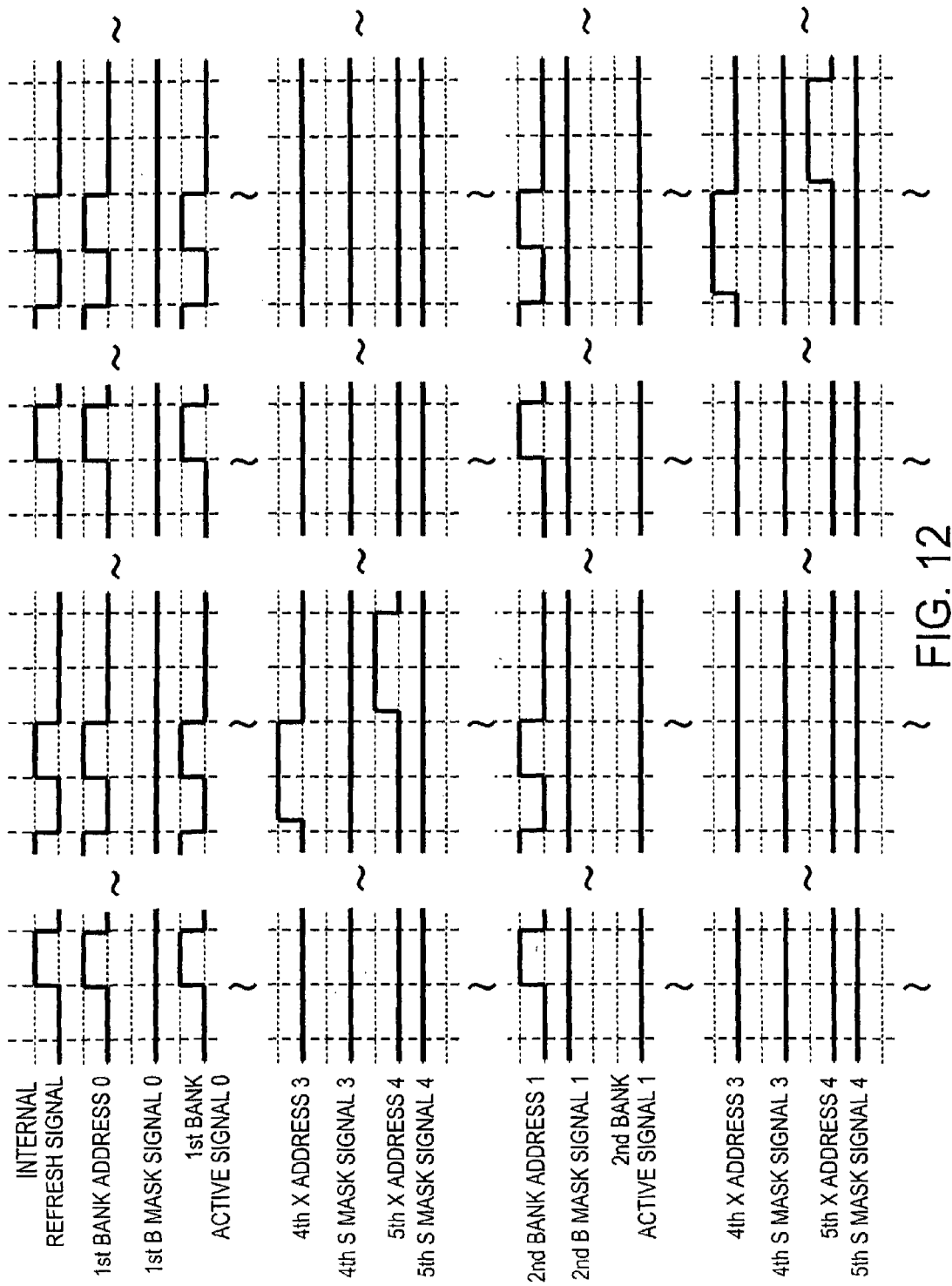
FIG. 12 is a wave form chart for use in describing a relationship among the S mask signals, the B mask signals, and the internal refresh signal.

FIG. 12 shows a view of waveforms of various signals related to the first and the second bank0 and bank1.

In the first bank0, inasmuch as the first B mask signal 0 has the logic "low" level, the first bank active signal 0 also becomes the logic "high" level in accordance with the logic "high" level of the first bank address 0. On the other hand, in the second bank1, inasmuch as the second B mask signal 1 has the logic "high" level, the second bank active signal 1 maintains the logic "low" level although the second bank address 1 becomes the logic "high" level.

In addition, inasmuch as the fourth S mask signal 3 has the logic "low" level and the fifth S mask signal 4 has the logic "high" level, the internal refresh signal is allowed at the fourth decoded signal 3 and is inhibited at the fifth decoded signal 4.

The comparator 610, the X decoder 910, the first through the eighth comparators 920 to 927, and the self control circuit 930 which are described above are, for example, disposed at (e.g. a position 350 in FIG. 3) between the control logic circuit 250 serving as a control circuit for a plurality of banks in common, the low address buffer and refresh controller 240, and the row decoders 210 which are independently disposed each bank.

Now, the memory cell array 110 is composed of the plurality of memory banks (the first through the eighth bank0 to bank7) in the manner which is described above, and each memory bank 115 is composed of the plurality of memory segments (the first through the eighth segment0 to segment7). Furthermore, each memory segment 114 is composed of the plurality of memory mats. Then, the sense amplifiers 116 are configured, for example, as FIG. 13 with they corresponded to the respective memory mats.

Figure 13:
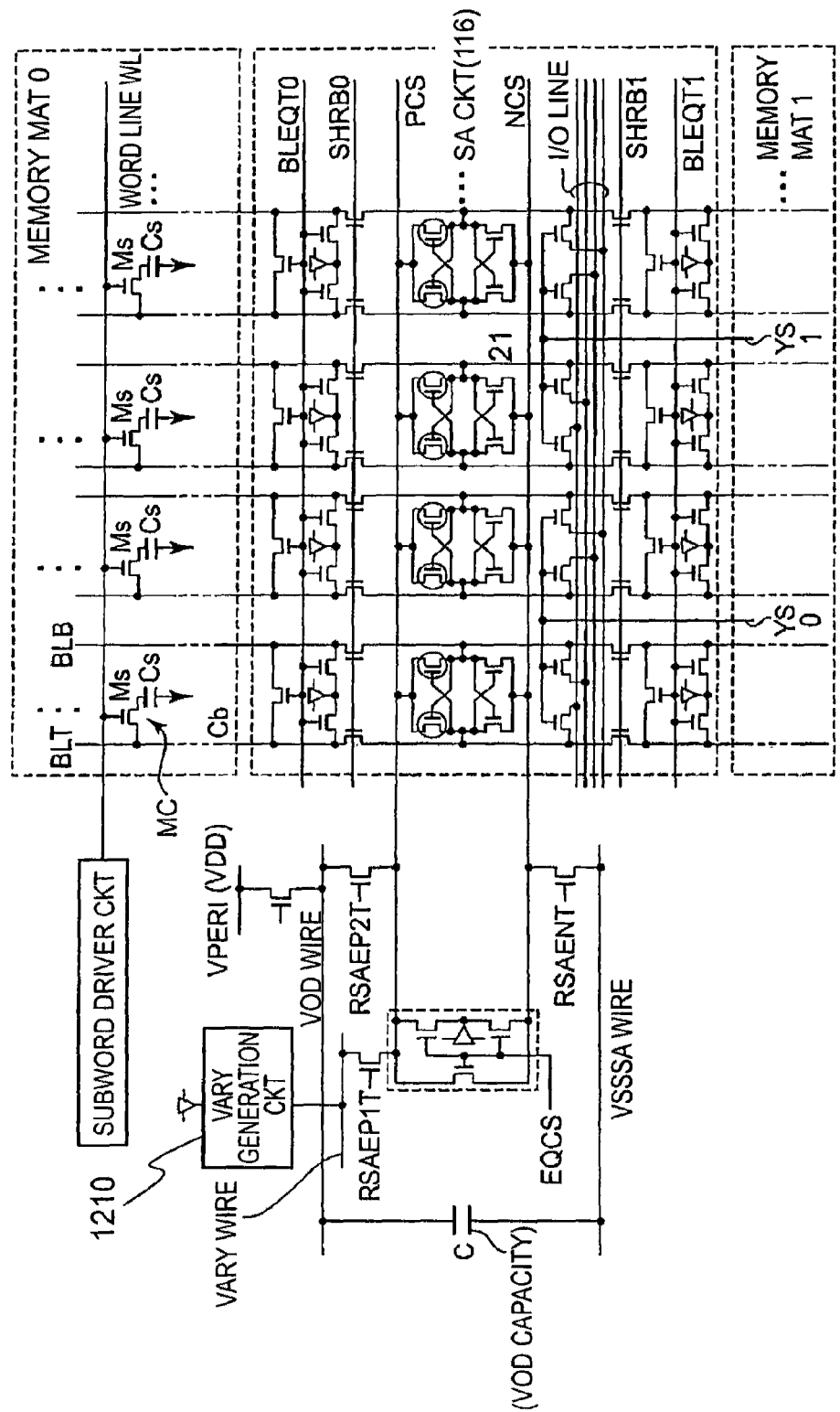
FIG. 13 is a circuit diagram showing sense amplifiers and a peripheral circuit thereof.

In the example being illustrated in FIG. 13, one sense amplifier (SA circuit) 116 is shared by a first memory mat 0 and a second memory mat 1. Hence, the first memory mat 0 and the second memory mat 1 are put into a relationship of exclusive-control each other. The exclusive-control means that memory cells included in the first memory mat 0 and memory cells included in the second memory mat 1 are not simultaneously accessed. These sense amplifiers are connected to a source power supply line PCS in common and are simultaneously activated. The source power supply line PCS is connected to an internal power supply line (VARY wire) via a switch PSAEP1T and is supplied with an internal power supply voltage from an internal power supply circuit (VARY generation circuit) 1210 included in the semiconductor device 10. An activated sense amplifier amplifies a potential difference occurred between the bit line pair (BLT, BLB) connected to the sense amplifier in question and raises the potential of the bit line (either of BLT and BLB) of a high potential side to a potential equal to the potential of the internal power supply line (VARY wire).

The internal power supply line is connected to all of sense amplifiers included in the memory cell array 110 through switches and common source power supply lines in the manner similar to that shown in FIG. 13. Therefore, when the number of sense amplifier arrays simultaneously activated is many, there is a high possibility that the internal power supply voltage (the potential of the internal power supply line) fluctuates. It is possible to simultaneously activate a plurality of sense amplifier arrays belonging to banks which are different from one another. In addition, it is possible to simultaneously activate a plurality of sense amplifier arrays belonging to segments which are different from one another although the sense amplifiers belong to the same bank. Accordingly, on refresh operation, when the number of banks serving as refresh-target is many and when the number of segments is many, there is a high possibility that the internal power supply voltage fluctuates. Inasmuch as supply (restore) of electric charges to memory cells serving as refresh-target is carried out through the internal power supply line, reduction (fluctuations) of the internal power supply voltage results in a loss of quantity of electric charges in the restore.

Thus, in the exemplary embodiment, the third delay time D3 for determining the active time-out time interval is changed in accordance with the number of the memory areas serving as refresh-target (the number in one refresh operation). It is therefore possible to supply an adequate quantity of electric charges to the memory cells from the internal power supply circuit through the internal power supply line. In other words, it is possible to ensure a time interval for recovering the potential of the internal power supply line that reduces by the refresh operation up to a predetermined potential.

Figure 14:
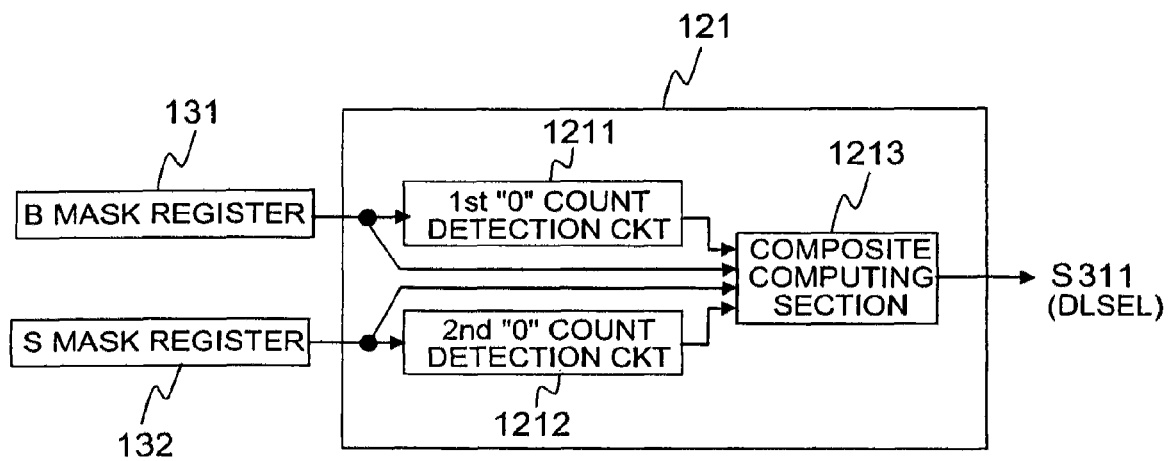
FIG. 14 is a block diagram showing an example of internal configuration of a number (count) of refresh-target areas determining circuit included in the semiconductor device illustrated in FIG. 2.

The number (count) of refresh-target areas determining circuit 121 is configured, for example, to as shown in FIG. 14. That is, the number (count) of refresh-target areas determining circuit 121 comprises first and second "0" number (count) detection circuits 1211, 1212, and a composite computing portion 1213.

The first "0" number detection circuit 1211 detects how many "0" are there in the information (the bank operation values) set in the B mask register 131. Likewise, the second "0" number detection circuit 1212 detects how many "0" are there in the information (the segment operation values) set in the S mask register 132.

The composite computing portion 1213 generates the delay selection signal S311 on the basis of detected results of the first and the second "0" number detection circuits 1211 and 1212 and set information from the B mask register 131 and the S mask register 132. The delay selection signal S311 may be a signal for selecting one of a plurality of stepwise delay times preliminarily prepared in accordance with structure of the third delay circuit 256-2.

Figure 15:
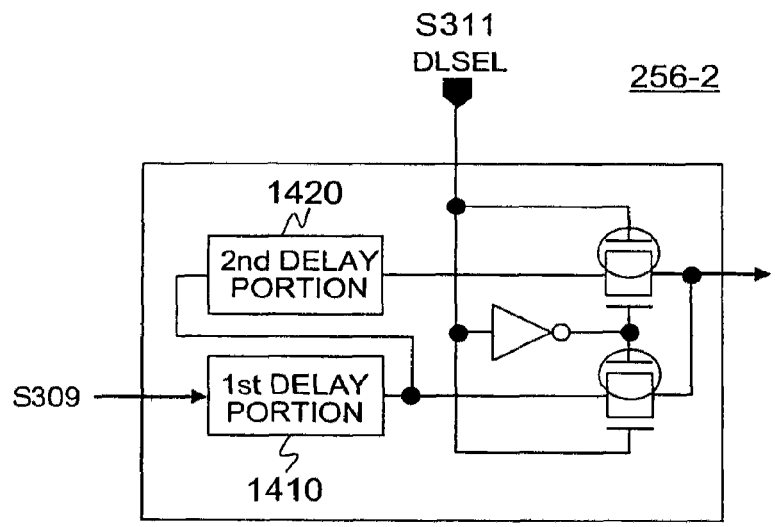
FIG. 15 is a block diagram showing an example of internal configuration of a delay circuit for changing an active time-out time interval.

For example, it is assumed that the third delay circuit 256-2 illustrated in FIG. 4 comprises first and second delay portions 1410 and 1420 as shown in FIG. 15 and is configured so as to path through the second delay portion 1420 or to make the second delay portion 1420 a by-pass. In this event, if the number of the memory areas serving as the refresh-target is not more than a predetermined number (e.g. one-half), the composite computing portion 1213 makes the second delay portion 1420 the by-pass to make the third delay time D3 short. If number of the memory areas serving as the refresh-target is more than the predetermined number (e.g. one-half), the composite computing portion 1213 makes the second delay portion 1420 path through to make the third delay time D3 long. It is therefore possible to increase the time interval for supplying the electric charges from the internal power supply circuit to the internal power supply line and it is possible to ensure the time interval for recovering reduction of the voltage of the internal power supply line. That is, it is possible to prevent a loss of quantity of electric charges from occurring in sensing operation (restoring) of the sense amplifiers. It is therefore possible to add adequate electric charges to the memory cells on the refresh operation.

Figure 16:
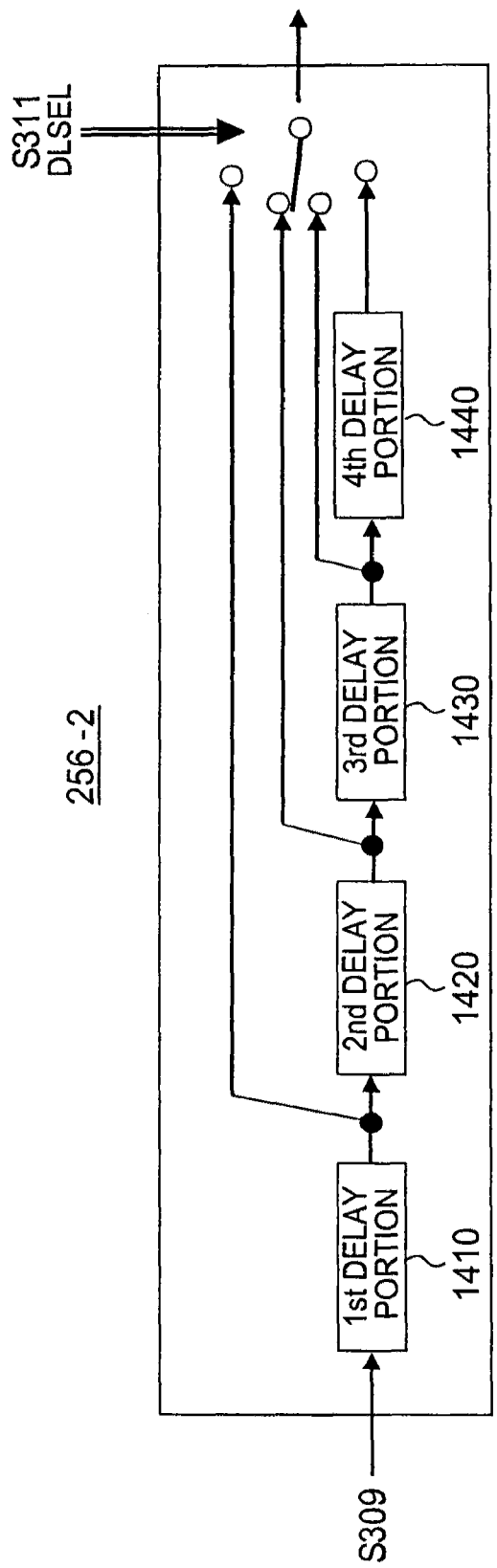
FIG. 16 is a block diagram showing another example of internal configuration of a delay circuit for changing the active time-out time interval.

In addition, it is possible to control the third delay time D3 in further multi-stages by configuring the third delay circuit 256-2 by a combination of three or more delay portions and a switch. FIG. 16 shows a configured example of the third delay circuit 256-2 in a case of controlling the third delay time D3 in four stages. That is, the third delay circuit 256-2 comprises first through fourth delay portions 1410, 1420, 1430, 1440 and one selector switch. Under whatever circumstances, the third delay circuit 256-2 comprises, as a signal path from an input to an output, a plurality of selectable paths having different delay time intervals or a switchable path to select or switch it in accordance with the number of the memory areas serving as the refresh-target.

The plurality of delay sections included in the third delay circuit 256-2 may have the delay time equal to one another or the delay times different from one another.

In the manner which is described above, in the semiconductor device according to this exemplary embodiment, it is possible to change the active time-out time interval in accordance with the number of the memory areas serving as the refresh-target. It is therefore possible to work around the event where electric charges required to restore are short on the refresh operation to appropriately carry out the restore and it is possible to improve reliability in the semiconductor device 10.

While the invention has been particularly shown and described with reference to exemplary embodiments thereof, the invention is not limited to these embodiments. It will be understood by those of ordinary skilled in the art that various changes in form and details may be made therein without departing from the sprit and scope of the present invention as defined by the claims.

For example, a technical idea of the present application may be applied to semiconductor devices related to nonvolatile memory cells except the DRAM. There is a case of carrying out refresh as the so-called retention defect measure which is known on those of ordinary skilled in the art in the nonvolatile memory cells also.

In addition, circuit forms in each circuit block and circuits for generating other control signals disclosed in the above-mentioned exemplary embodiment are not limited to these circuit forms disclosed and may be ones which can achieve the object thereof.

Furthermore, the technical ides of the semiconductor device of this invention can be applicable to various semiconductor devices. For example, this invention can be applicable to the semiconductor products in general such as a CPU (Central Processing Unit), an MCU (Micro Control Unit), a DSP (Digital Signal Processor), an ASIC (Application Specific Integrated Circuit), an ASSP (Application Specific Standard Circuit), a memory, and so on. In addition, a device to which this invention is applicable can be applied to semiconductor devices such as a SOC (System On Chip), an MCP (Multi Chip Package), a POP (Package On Package), or the like. This invention can be applicable to semiconductor devices having any product form, any package form described above.

In addition, the transistors may be field effect transistors (FETs). The transistors can be applicable to various FETs such as not only MOS (Metal Oxide Semiconductor) but also MIS (Metal-Insulator Semiconductor), TFT (Thin Film Transistor), or the like. Furthermore, bipolar transistors may be comprised to a part in the device.

Furthermore, NMOS transistors (N-type MOS transistors) act on behalf of first conductive-type transistors while PMOS transistors (P-type MOS transistors) act on behalf of second conductive-type transistors.

In addition, it is to be understood that different combinations or selections of various disclosed elements may be resorted within the scope of the subjoined claims of this invention. That is, of course, this invention includes various changes and modifications which would be made by those skilled in the art in accordance with all disclosure and technical ideas which include claims.

What is claimed is:

1. A device comprising:
    a plurality of memory areas, each of the plurality of memory areas including a plurality of memory cells required to perform a refresh of information stored in the plurality of memory cells by a plurality of sense amplifiers;
    a first control circuit determining a number of refresh-target memory areas among said plurality of memory areas associated with one refresh requirement signal at a time, said number is at least one and is indicative of how many of said memory areas are to be refreshed;
    a second control circuit controlling a refresh operation with respect to said refresh-target memory areas in accordance with said one refresh requirement signal; and
    a third control circuit adjusting an active time-out time interval according to the determined number of refresh-target memory areas in connection with said refresh operation, said active time-out time interval indicating a time interval from a first timing at said sense amplifiers are activated to a second timing at word lines are inactivated, said sense amplifiers and said word lines relating to said refresh-target memory areas.

2. The device as claimed in claim 1, wherein, when there are a plurality of refresh-target memory areas, said second control circuit causes said plurality of refresh-target memory areas to successively operate the refresh of information in a time sequence.

3. The device as claimed in claim 1, wherein said third control circuit makes said active time-out time interval longer when said determined number of refresh-target memory areas becomes larger.

4. The device as claimed in claim 1, further comprising an internal power supply circuit supplying a high potential to said sense amplifiers,
wherein said sense amplifiers supply to said memory cells that hold a high potential information in said refresh-target memory areas.

5. The device as claimed in claim 4, wherein each of said plurality of memory areas includes said plurality of sense amplifiers corresponding to said plurality of memory cells, respectively,
wherein said internal power supply circuit supplies the high potential to said plurality of sense amplifiers included in each of said plurality of memory areas.

6. The device as claimed in claim 5, wherein said plurality of sense amplifiers are connected to a power supply line in common.

7. The device as claimed in claim 5, wherein said plurality of memory areas comprises a plurality of segment arrays which has a relationship of non-exclusive control of one another and each of the plurality of segment arrays includes said sense amplifiers.

8. The device as claimed in claim 5, wherein said plurality of memory areas comprises a plurality of bank arrays which has a relationship of non-exclusive control of one another and each of the plurality of bank arrays includes said sense amplifiers.

9. The device as claimed in claim 8, wherein each of said bank arrays includes a plurality of segment arrays which has a relationship of non-exclusive control of one another and each of said plurality of segment arrays includes said sense amplifiers.

10. The device as claimed in claim 1, wherein further comprises a register holding information that indicates said refresh-target memory areas among said plurality of memory areas that become target of said refresh operation and supplies said information to said first control circuit.

11. The device as claimed in claim 10, wherein said plurality of memory areas comprises a plurality of bank arrays which has a relationship of non-exclusive control of one another, each of said plurality of bank arrays comprising a plurality of segment arrays which has a relationship of non-exclusive control of one another and each of said plurality of segment arrays includes said sense amplifiers,
wherein said register comprises a first register holding information to select whether or not to refresh each of said plurality of bank arrays, and a second register holding information to select whether or not to refresh each of said plurality of segment arrays,
wherein said first control circuit determines the number of said refresh-target memory areas on the basis of information held in said first and second registers.

12. The device as claimed in claim 1, wherein the third control circuit adjusts the active time-out time interval according to a total area of the plurality of memory areas through the determined number of refresh-target memory areas in connection with said refresh operation.

13. The device as claimed in claim 1, wherein as the active time-out time interval is controlled by the third control circuit in accordance with the number of the refresh-target memory areas, a restore is performed for each of the plurality of memory cells on the refresh operation, and
wherein the restore supplies respective desired restore potentials to the plurality of memory cells which the determined number of refresh-target memory areas include.

14. A method comprising:
controlling a device,
wherein said device comprises a plurality of memory areas, each of the plurality of memory areas including a plurality of memory cells,
said controlling comprising:
selecting a number of memory areas activated in accordance with one refresh operation, said number indicative of how many of said memory areas are to be refreshed; and
changing an active time-out time interval in accordance with said number of memory areas activated, the active time-out time interval indicating a time interval from a first timing at sense amplifiers are activated to a second timing at word lines are inactivated.

15. A device comprising:
a plurality of memory areas;
a register holding information indicative of a refresh-target memory areas among said plurality of memory areas;
an execution control circuit performing a refresh operation for said refresh-target memory areas on the basis of said information held in said register;
a number of refresh-target area determining circuit determining a number of said refresh-target memory areas on the basis of the information held in said register and producing a determined number indicative of how many of the memory areas are thereby to be refreshed; and
an active time-out time interval control circuit controlling an active time-out time interval in said refresh operation in accordance with the determined number.

16. The device as claimed in claim 15,
wherein said plurality of memory areas comprises a plurality of bank arrays, each comprising a plurality of segment areas,
wherein said register comprises a first register holding information to select whether or not to refresh each of said plurality of bank arrays, and a second register holding information to select whether or not to refresh each of said plurality of segment arrays,
wherein said number of refresh-target area determining circuit determining the number of said refresh-target memory areas on the basis of information held in said first and second registers.

17. The device as claimed in claim 16, wherein said active time-out time interval control circuit includes a delay circuit delaying an inputted signal by one delay time selected from a plurality of stepwise delay times by switching a signal path from an input to an output in accordance with the determined number.

18. The device as claimed in claim 17, wherein said delay circuit comprises a plurality of delay portions connected in series and a selector switch connected to outputs of the delay portions, said delay circuit selecting one of the outputs of said delay portions by said selector switch.

19. The device as claimed in claim 15, wherein said active time-out time interval control circuit includes a delay circuit delaying an inputted signal by one delay time selected from a plurality of stepwise delay times by switching a signal path from an input to an output in accordance with the determined number.

20. The device as claimed in claim 19, wherein said delay circuit comprises a plurality of delay portions connected in series and a selector switch connected to outputs of the delay portions, said delay circuit selecting one of the outputs of said delay portions by said selector switch.

21. The device as claimed in claim 20, wherein each of said plurality of delay portions provides a delay time different from any of the other of the plurality of delay portions.

22. The device as claimed in claim 16, wherein each bit of the first register corresponds to a respective one of the plurality of bank arrays, and each bit of the second register corresponds to a respective one of the plurality of segment arrays.

23. The device as claimed in claim 16, wherein said number of refresh-target area determining circuit include a first count detection circuit and a second count detection circuit, and said first register and said second register are coupled to said first count detection circuit and said second count detection circuit respectively.

24. The device as claimed in claim 23, wherein said number of refresh-target area determining circuit further includes a composite computing portion coupled to said first count detection circuit and said second count detection circuit, and said composite computing portion outputting a delay selection signal.

* * * * *